United States Patent
Frampton

(10) Patent No.: US 10,277,229 B2
(45) Date of Patent: Apr. 30, 2019

(54) COMMUNICATION OVER GENERATOR BUS

(71) Applicant: Kohler Co., Kohler, WI (US)

(72) Inventor: Isaac S. Frampton, Strattanville, PA (US)

(73) Assignee: Kohler Co., Kohler, WI (US)

( * ) Notice: Subject to any disclaimer, the term of this patent is extended or adjusted under 35 U.S.C. 154(b) by 859 days.

(21) Appl. No.: 14/262,374

(22) Filed: Apr. 25, 2014

(65) Prior Publication Data

US 2015/0311903 A1    Oct. 29, 2015

(51) Int. Cl.
| | |
|---|---|
| *G05D 3/12* | (2006.01) |
| *H03L 5/02* | (2006.01) |
| *H02P 9/00* | (2006.01) |
| *G05B 15/02* | (2006.01) |
| *H04B 3/54* | (2006.01) |

(52) U.S. Cl.
CPC ............... *H03L 5/02* (2013.01); *G05B 15/02* (2013.01); *H02P 9/00* (2013.01); *H04B 3/542* (2013.01)

(58) Field of Classification Search
CPC ........................................ H03L 5/02
USPC ........................................ 700/287
See application file for complete search history.

(56) References Cited

U.S. PATENT DOCUMENTS

| | | | | |
|---|---|---|---|---|
| 4,500,844 A | * | 2/1985 | Lisco ................... | H03B 28/00 330/10 |
| 5,581,229 A | * | 12/1996 | Hunt ..................... | G01R 31/44 340/12.32 |
| 5,828,293 A | | 10/1998 | Rickard | |
| 6,559,757 B1 | | 5/2003 | Deller et al. | |
| 6,631,310 B1 | | 10/2003 | Leslie | |
| 6,668,629 B1 | | 12/2003 | Leslie | |
| 6,778,921 B2 | * | 8/2004 | Keane .................... | H02J 1/102 307/31 |
| 6,986,071 B2 | * | 1/2006 | Darshan ................. | H04L 12/10 700/286 |
| 6,987,406 B1 | * | 1/2006 | Chiu ..................... | H03K 23/50 327/156 |
| 7,042,351 B2 | | 5/2006 | Kline | |

(Continued)

FOREIGN PATENT DOCUMENTS

| | | |
|---|---|---|
| DE | 19911217 A1 | 10/2000 |
| DE | 10014183 A1 | 10/2001 |

(Continued)

OTHER PUBLICATIONS

European Search Report for related European Application No. 15164960.5 dated Sep. 25, 2015.

(Continued)

*Primary Examiner* — Evral E Bodden
(74) *Attorney, Agent, or Firm* — Lempia Summerfield Katz LLC

(57) ABSTRACT

A generator system includes at least one generator, at least one generator controller, and a power bus. The power bus transmits power to a load circuit. Data communications are also transmitted by the power bus. In one example, multiple generator controllers exchange messages over the power bus. In another example, one or more generator controllers exchange messages with a central controller over the power bus. The messages may include a status for the generators, output values for the generators, or commands for the generators.

16 Claims, 7 Drawing Sheets

(56) References Cited

U.S. PATENT DOCUMENTS

| | | | |
|---|---|---|---|
| 7,236,765 B2 | 6/2007 | Bonicatto et al. | |
| 7,685,325 B2 | 3/2010 | Batchelor et al. | |
| 7,770,847 B1* | 8/2010 | Severson | A63H 19/24 |
| | | | 246/1 C |
| 7,791,468 B2 | 9/2010 | Bonicatto et al. | |
| 8,300,439 B2 | 10/2012 | Little et al. | |
| 8,301,312 B2* | 10/2012 | Saikkonen | H02J 3/48 |
| | | | 307/69 |
| 8,325,059 B2 | 12/2012 | Rozenboim | |
| 8,373,569 B2 | 2/2013 | Gilpatrick | |
| 8,407,016 B2 | 3/2013 | Slota et al. | |
| 8,525,492 B2 | 9/2013 | Peterson et al. | |
| 8,547,668 B2 | 10/2013 | Dahlen | |
| 8,612,657 B2 | 12/2013 | Lance et al. | |
| 8,631,275 B2 | 1/2014 | Opina, Jr. et al. | |
| 9,077,208 B2* | 7/2015 | Bickel | H02J 3/24 |
| 2008/0097655 A1* | 4/2008 | Hadar | H02J 13/002 |
| | | | 700/286 |
| 2009/0085612 A1* | 4/2009 | Smith | H03K 17/0822 |
| | | | 327/108 |
| 2010/0078938 A1 | 4/2010 | Coons et al. | |
| 2010/0094490 A1 | 4/2010 | Alston et al. | |
| 2010/0148588 A1 | 6/2010 | Algrain | |
| 2010/0207454 A1* | 8/2010 | Jagota | H02J 1/10 |
| | | | 307/80 |
| 2012/0049638 A1 | 3/2012 | Dorn et al. | |
| 2012/0187770 A1 | 7/2012 | Slota et al. | |
| 2012/0205986 A1 | 8/2012 | Frampton et al. | |
| 2013/0003756 A1 | 1/2013 | Mitchell et al. | |
| 2013/0041514 A1 | 2/2013 | Apalenek et al. | |
| 2013/0128392 A1 | 5/2013 | Maglaque | |
| 2013/0215981 A1 | 8/2013 | Fornage | |
| 2015/0311749 A1* | 10/2015 | Frampton | H02J 3/38 |
| | | | 307/65 |

FOREIGN PATENT DOCUMENTS

| | | |
|---|---|---|
| DE | 102013106151 | 1/2014 |
| EP | 2672602 | 12/2013 |

OTHER PUBLICATIONS

Wade et al., One-Wire Smart Motors Communicating over the DC Power Bus-Line with Application to Endless Rotary Joints, 2002, Massachuesetts Institute of Technology.

* cited by examiner

COMMUNICATION OVER GENERATOR BUS

TECHNICAL FIELD

This disclosure relates in general to communication over a generator bus, or more particularly, a generator bus for transmission of the power output of a generator and data communications of the generator.

BACKGROUND

The reliability of power companies depends on many factors such as the weather, usage spikes, short circuits, accidents or other damage to transmission lines or power stations. Certain locations may be particularly prone to blackouts. Low lying areas may be susceptible to floods. Coastal areas may be susceptible to hurricanes. High usage geographic areas may be susceptible to rolling blackouts.

Any breaks in power utility service may be unacceptable to customers, and some businesses may have mission critical systems, such as computer systems in call centers or refrigerators in grocery stores, that rely on constant power. In other businesses such as hospitals, lives may be lost if the power to a respirator is interrupted. These customers may rely on a backup source of power.

One backup source of power is a generator. The generator, or multiple generators, is connected to the power system instead of or in addition to the power utility service. When multiple generators are connected, the generators may communicate with one another through a communication system. Further, switching logic for switching between the power utility service and one or more generators may communicate with the generators via a communication system. However, the communication system may be difficult to install and configure for some users, and the communication system may be prone to failures or other errors.

BRIEF DESCRIPTION OF THE DRAWINGS

Exemplary implementations are described herein with reference to the following drawings.

DETAILED DESCRIPTION

Figure 1:
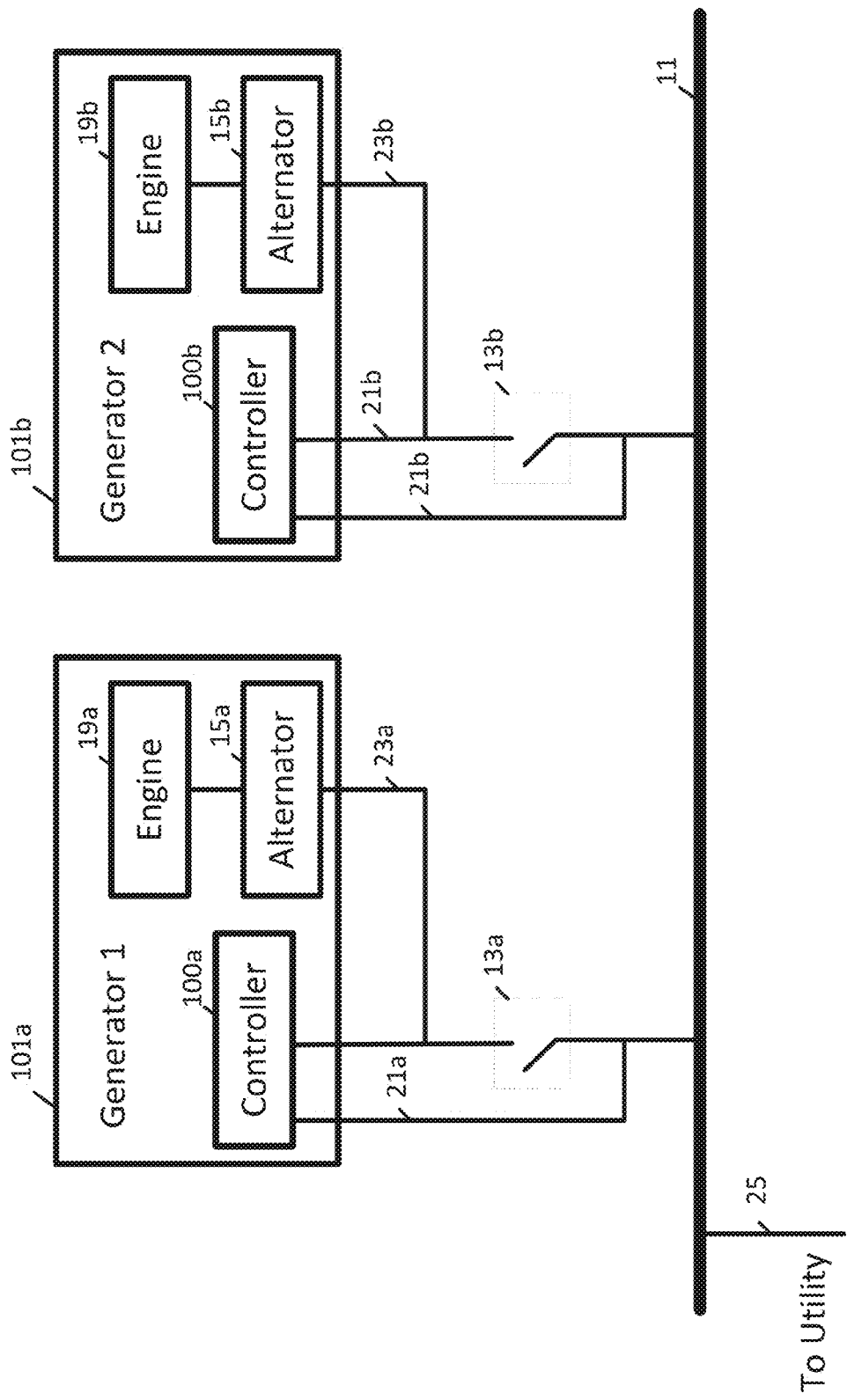
FIG. 1 illustrates an example system including communication over a power bus.

An engine-generator set, which may be referred to as a generator or a genset, may include an engine and an alternator or another device for generating electrical energy or power. One or more generators may provide power to a load through a power bus. The power bus, which may be referred to as a generator bus or common bus, may also provide a communication path for some or all communications within the generator system. A generator communication network may include one or more transfer switches, one or more generator controllers, and one or more centralized controllers. The generator controllers manage the operation of the generators including output levels, engine speeds, and synchronization timing. The transfer switches or centralized controllers may manage switching the generators to and from a load and may also coordinate operations among generator controllers such as load sharing and load shedding.

Data communication with the generator controllers may be classified as inbound communications and outbound communications. Inbound communication may include commands to start a generator, stop a generator, adjust an output of a generator, or adjust a speed of an engine of a generator. Outbound communications may include measured operating parameters of a generator or commands for other generators or a transfer switch. When the outbound communications are transmitted over the power bus, the generator system may become more versatile because data can be retrieved anywhere along the power bus or even within the load. For example, when the load is residential or residential electrical circuit, the data could be retrieved from a device plugged into any electrical outlet of the residential electrical circuit.

In addition, when the inbound communications are transmitted over the power bus, additional advantages are realized. First, the data communication network may be removed from the generator system, resulting in lower costs. Second, installation and configuration is simplified because fewer connections are needed. Third, the number of potential failure points is reduced. If the generator system does not include a communication system, the communication system cannot require maintenance or repair. Potential failures along the communication cables and connections are eliminated.

In other words, the power bus must be functioning and the one or more generators must be correctly connected to the power bus in order for the generator system to deliver power. Similarly, the power bus must be functioning in order for the communications to flow to or from the generator controllers. Thus, communications are necessary only when the power bus is functioning properly.

This phenomenon may be illustrated by analyzing possible states of the system. When the power bus is independent of the communication system, four states are possible: 1) the power bus and the communication system are functioning, 2) the power bus is malfunctioning and the communication system is functioning, 3) the power bus is functioning and the communication system is malfunctioning, and 4) the power bus and the communication system are malfunctioning. The system is operational only in the first state, when both the power bus and the communication system are functioning properly. The system is not operational in the other three states.

However, when communications are transmitted over the power bus, a valid connection to the power bus allows communication and power delivery. Any generators that are capable of communicating are capable of providing power. Thus, the number of available generators can be detected. Assuming no additional failures are introduced, the generator system will be functioning properly when the power bus is operational, as opposed to requiring both the communication system and separate power bus to be operational, which improves the reliability of the system by reducing the points of failure described above.

FIG. 1 illustrates an example system including communication over a power bus. The system includes generators 101a and 101b connected to a bus 11, and any number of additional generators may be included. The generators 101*a-b* may be the same, similar, or different. The generators 101*a-b* may each include one or more of generator circuit breakers 13*a-b*, alternators 15*a-b*, generator controllers 100*a-b*, and engines 19*a-b*. A communication line 21*a* and 21*b* may facilitate data communication between the generator controllers 100*a* and 100*b* and the bus 11. The alternators 15*a-b* may include a rotor and a stator. The stator may include output windings, and the rotor may include field windings. A power connection line 23*a* and 23*b* may facilitate power transmission to the bus 11. The generators 101*a-b* may also include a fuel supply, a speed governor, a cooling system, an exhaust system, a lubrication system, and a starter. Additional, different, or fewer components may be included.

Example types of generators include towable generators, portable generators, marine generators, industrial generators, residential generators or other standby generators. The generators may be temporary or permanent. Because the generators communicate over the bus 11, the generators may be coupled only by bus 11. Thus, the user of the generators may connect or install the generators with a single cable connection.

Either of the controllers 100*a-b* may identify or detect a power signal from an additional power source. For example, the controller 100*a* may identify or detect a power signal on the bus 11 that originates with generator 101*b*, and the controller 100*b* may identify or detect a power signal on the bus 11 that originates with generator 101*a*. In another example, either of the controllers 100*a-b* may identify or detect a power signal that originates with the utility that is connected to the bus 11 through communication line 25.

The controller 100*a* or 100*b* may detect a voltage or current at the bus 11. Although not illustrated, the controller 100*a* or 100*b* may also be connected to the bus 11 through an electrically conductive testing path for identifying the power signal on the bus 11. The power signal indicates that at least the other source (utility or generator) is connected to the bus 11 and outputting power. The power signal may be supplied by multiple sources. For example, multiple generators may be supplying power to the bus 11 at the same time or the utility may be supplying power to the bus at the same time as one or more generators.

Either of the controllers 100*a* and 100*b* may also receive data communications through the bus 11. The data communication may originate with another generator controller or with an external device. The data communications may include status signals, generator commands, or other data.

The status signals may include different types of information and be received from a variety of devices. Status signals may include discovery data, operating parameters, measured data, or other information, and the status signals may be received from another generator, a central controller, a utility, or another device. The discovery data may be availability signals, connection information, or both.

An availability signal for a utility may include data indicative of whether or not the utility is available to supply power to the bus 11. Likewise, an availability signal for a generator may include data indicative of whether the generator is available to supply power to the bus 11. The status signal received from the bus 11 may include multiple availability signals from multiple devices.

The connection information may include a connection status for various devices. The connection status may include data indicative of whether the device is connected to the bus 11. The connection information may include a switch setting for a breaker such as breakers 13*a* and 13*b*. The switch stetting may indicate an ON status, an OFF status, an open status, or a closed status. The connection status may be received from controllers 100*a* and 100*b* or directly from the circuit breakers.

When generator 101*b* is connected to the bus 11 and added to the system, generator 101*a* may detect the addition of the new generator. The controller 100*b* may transmit the connection signal when the generator 101*b* is connected to bus. The controller 100*b* may transmit the availability signal when the generator 101*b* is available and ready to supply power. The controller 100*a* may monitor the bus 11 for communications from the controller 100*b* and any other controllers and receive the connection information and availability information from the generator 101*b*. Based on the received information, the controller 100*a* may track the number and identities of generators connected to the bus 11.

Other generator controllers may follow procedures similar to that described with respect to controller 100*a*. Various communication techniques may be used to notify newly connected generators of the existence of already connected generators, as described in examples below.

The operating parameters may include settings or outputs from the generators 101*a* or 101*b*, the utility, or a transfer switch. The operating parameters may be inferred from settings (e.g., when the generator is set to output 120V, the operating parameter indicates 120V even though actual levels may vary). The settings may include a power setting, a voltage output setting, a frequency setting or another output setting. Alternatively, the operating parameters may include measured data collected from one or more sensors. The sensors may include any combination of a voltage sensor, a current sensor, a tachometer, a torque sensor, a deflection sensor, a dynamometer, a positional sensor, or a revolution sensor.

The generator commands are received at one generator controller (e.g., controller 100*a*) from another generator controller (e.g., controller 100*b*) or from an external device. The generator commands may include speed commands, output commands, or synchronization commands. A speed command may describe a target speed for engine 19*a*, and the controller 100*a* adjusts a throttle for the engine 19*a* based on the speed command. The output command may describe a target output voltage or power level, and the controller 100*a* adjusts a field winding voltage, which impacts the output of the alternator 15*a*. The synchronization command may include a combination of phase angle and output level in order to bring the generator 101*a* in synchronization with generator 101*b* and/or the utility.

Any or all of the status signals, generator commands, or other data may include an identifier that describes the sender. The identifier may include a code that is associated with the type of sending device (e.g., G for generator, S for transfer switch, or U for utility). The identifier may include a serial number of the sending device, a model number of the sending device, a rating of the sending device, or a network address of the sending device. The rating of the sending device may be a power rating (e.g., 20 kW, 40 kW, or another value), a voltage rating (e.g., 50 V, 120 V, 240 V, or another value), or an age rating (e.g., number of operating hours, model year, or another value).

The data communications may be added to the bus 11 by the other generator controller 100*a* and 100*b* or by an external device. The data communications may be modulated on a power signal by the generator controller 100*a* and 100*b* or the external device. The power signal may have a high amplitude and a low frequency (e.g., 120 V or higher at 50-60 Hz). The modulated data communication signal may have a low amplitude and a high frequency (e.g., 5 V-20 V at 1 kHz or higher). The modulation may comprise adding the modulated data communication signal to the power signal.

The generator controller 101a or 101b may filter the power signal including the modulated data communication signal. In one example, the filter is a high pass filter. The high pass filter may be defined by a critical frequency that is substantially less that the frequency of the data communication signal and substantially greater than the frequency of the power signal. Example critical frequencies include 1000 Hz, 10,000 Hz, or 100,000 Hz. The high pass filters passes the data communication and suppresses or attenuates the power signal.

In one alternative, a low pass filter may also be used to remove the data communication signal from the power signal before sending the power signal to the load. In many applications the data communication signals may have no detrimental effects to powering the load. However, in some applications the data communication signals may cause unwanted noise.

The alternators 15a and 15b may be electromechanical devices. The alternators 15a and 15b may include a rotating magnetic field and a stationary armature, a rotating armature with a stationary magnetic field, or a linear alternator. The engines 19a and 19b may be powered by gasoline, diesel fuel, or gaseous fuel. The gaseous fuel may be liquefied petroleum gas (LPG), hydrogen gas, natural gas, biogas, or another gas. The LPG may be or include primarily butane, primarily propane, or a mixture of hydrocarbon gases. The hydrogen gas may include hydrogen mixed with air or oxygen. The hydrogen gas may be mixed with another fuel when delivered to the engine. Natural gas (e.g., compressed natural gas (CNG)) may be a hydrocarbon gas mixture. Biogas may be a gas produced by the breakdown of organic material. Other variations are possible.

Figure 2:
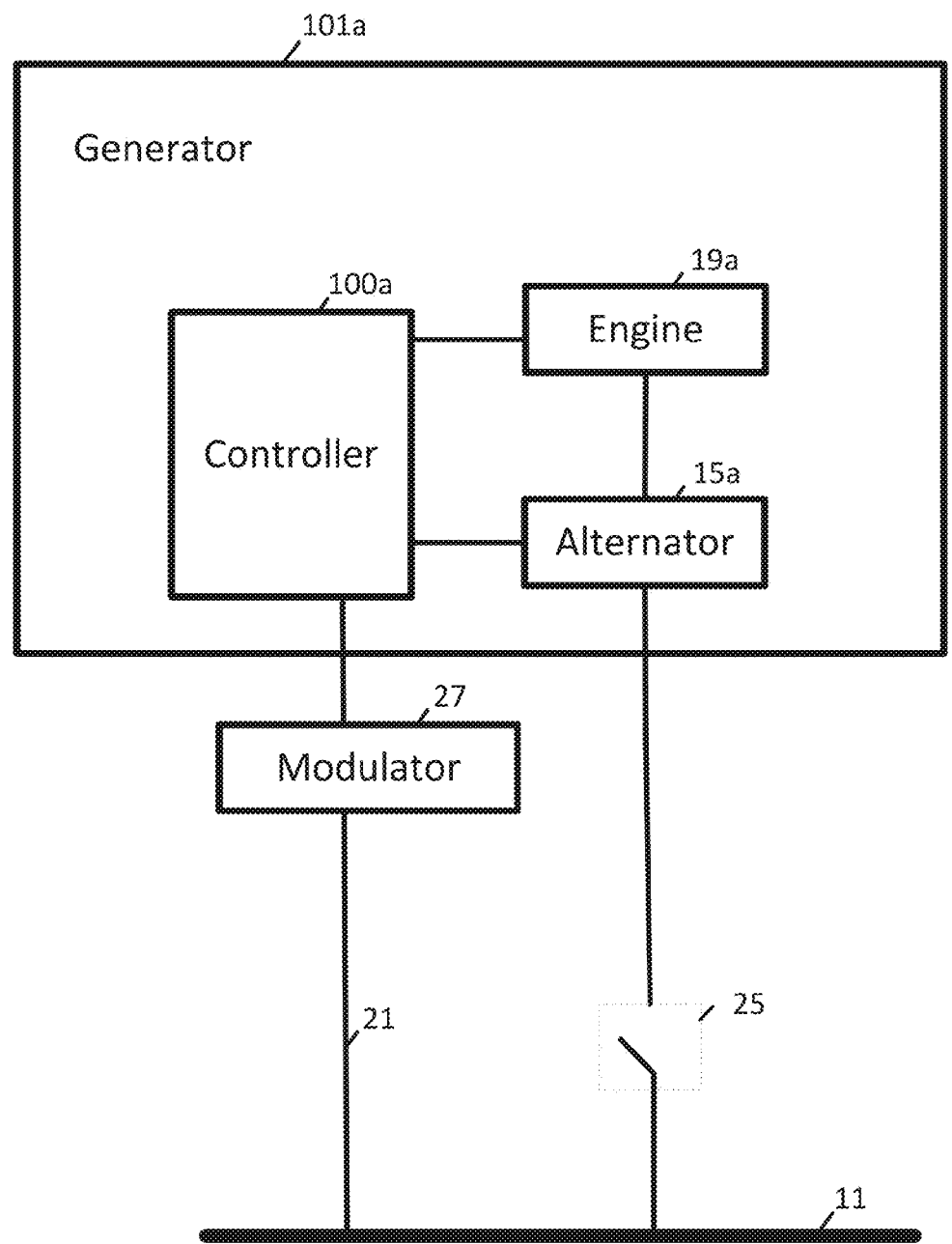
FIG. 2 illustrates an example generator for the system of FIG. 1.

FIG. 2 illustrates another example for generator 101a for the system of FIG. 1. The generator controller 100a may be directly connected to the bus 11 independent from the breaker 25. That is, the breaker 25 may selectively connect and disconnect the alternator 15a from the bus 11, but the modulator 27 and communication path 21 may be continuously connect the controller 100a to the bus 11. The modulator 27 may be integrated with generator controller 100a. Alternatively, the communication path 21 may include an independent switch.

The modulator 27 modifies the data communications to facilitate transmission over the bus 11. The modulator 27 may receive a digital signal from the controller 100a and output a high frequency signal. The digital signal may include data indicative of the status information, operating parameters, or generator commands above, which may include an identifier associated with the controller 100a or the generator 101a.

The modulator 27 combines the data with a high frequency carrier signal using a modulation technique. The frequency of the high frequency carrier signal may be selected and/or adjusted to maximize impedance of the power bus 11. The power bus 11 may have a very low impedance (e.g., 1 ohm) based on the physical properties of the bus 11 and connected loads. The frequency of the high frequency carrier signal may be a function of the number and type of generators connected to the bus 11. The frequency of the high frequency carrier signal may be adjusted to reduce internal reflections of the communication signals.

The modulation technique may be amplitude modulation, frequency modulation, phase shift keying, frequency shift keying, spread spectrum, or another technique. The modulation technique specifies a modulation frequency that is carried by the power signal of the bus 11.

The bus 11 may be designed to transmit both low frequency power signals and high frequency communication signals simultaneously. The bus 11 may be shielded with an insulator or other shielding to prevent emitting high frequency signals that could interfere with radio transmissions. The bus 11 may include repeaters for boosting the data signal for longer transmission distances. The repeaters may filter the data communication signal transmitted at a low power level and retransmit the data communication signals at a higher power level. The bus 11 may be sized and shaped to reduce internal reflections of the communication signals.

The controller 100a may generate a return signal based on operating parameters of the generator. The return signal may be generated in response to one of the status signals, operating parameters, or generator commands described above. The return signal may be an operating parameter of the generator 101a such as an operating speed of the engine 19a, an estimated output level from the alternator 15a, or a detected output level from a sensor associated with the generator 101a.

The return signal may be any of the generator commands (e.g., a synchronization command, a speed command, an activation command, a deactivation command, or command to close the first generator to the bus) for another generator (e.g., generator 101b). The return signal may be any of the status signals of the generator 101b such as whether the generator 101a is on or off, or a setting for the breaker 25.

Figure 3:
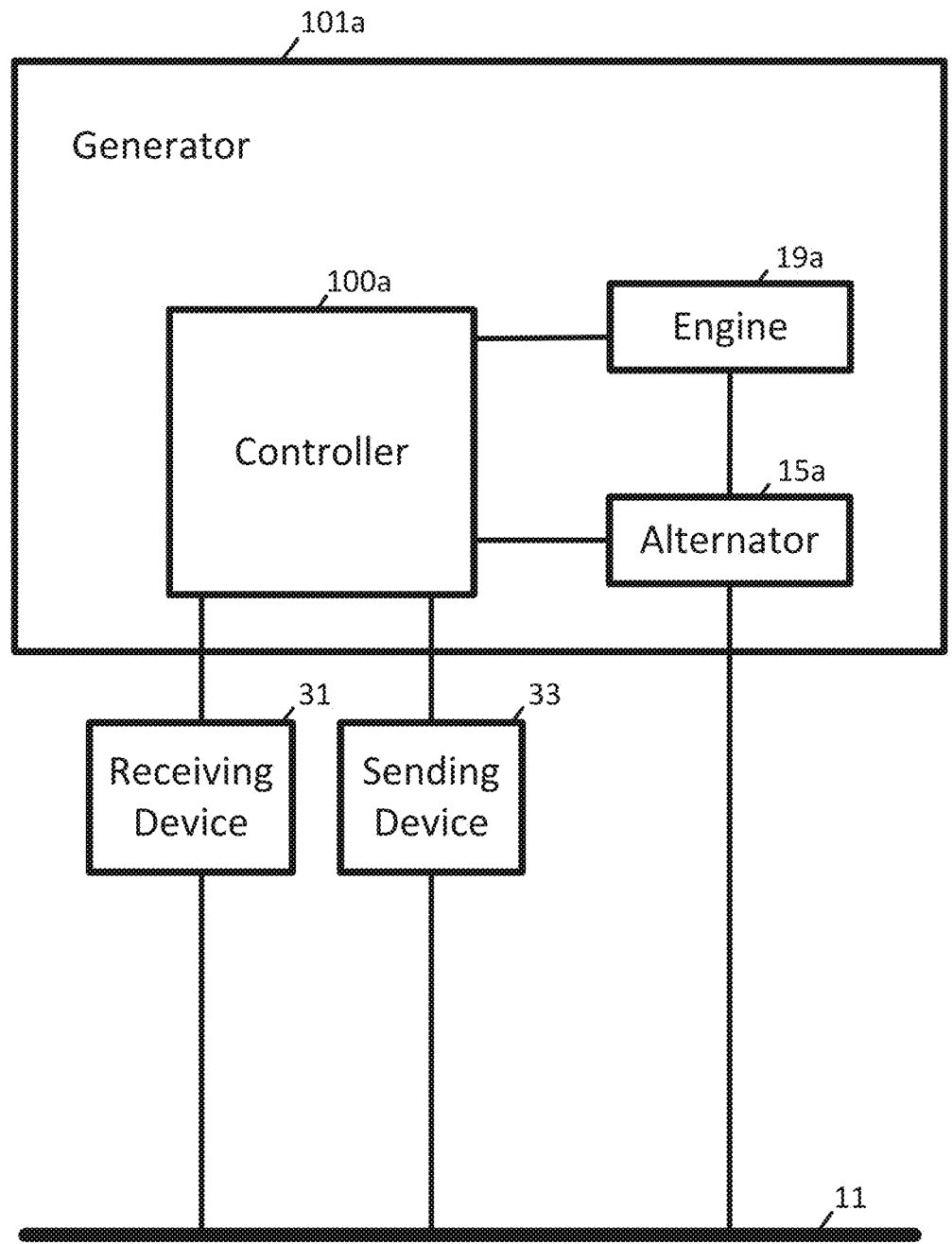
FIG. 3 illustrates another example generator for the system of FIG. 1.

FIG. 3 illustrates another example for the generator 101 of the system of FIG. 1. The controller 100a may be coupled to a receiving device 31 and a sending device 33, which are coupled to the bus 11. The receiving device 31 may include demodulator, and the sending device 33 may include a modulator. Accordingly, the receiving device 31 may extract data indicative of identifiers, the status signals, operating parameters, or generator commands received from another generator or another device, and the sending device 33 may add data indicative of an identifier, status signals, operating parameters, or generator commands from the controller 100a.

The controller 100a may store the extracted data in memory. In one example, the controller 100a may store the identifier and other data for each received message derived from a received signal in a log file along with a time stamp that describes a time and date that the signal was received. In one example, the log file may include a portion designated for each external device. Each designated portion may include a predetermined number of messages for that device. For example, controller 100a may include a log file with a portion designated to store time stamps and messages received including an identifier associated with generator 101b. The portion of the log file may store the 16 most recent messages that the first message received becomes the first message removed when the predetermined number of messages is reached.

The messages may include data from the status signals, operating parameters, generator commands, or other data described above. The log file may be used in various ways. The log file may define the operation of the controller 100a. Controller 100a may access the log file to retrieve recent commands from one or more external devices for determining the operation of the generator 101.

In addition, the log file may be accessed to diagnose the external devices. For example, if generator 101b experiences a failure, generator 101b may not be accessible. However, the log file stored by controller 100*a* may include recent operating parameters sent by generator 101*b*. The failure of generator 101*b* may be diagnosed from the log file of controller 100*a*.

The controller 100*a* may select the operating parameters for the log file according to a predetermined set of operating parameters. In one example, the predetermined set of operating parameters may be "running" and "not running." Thus, the controller 100*a* translates any normal operating speed to "running" when recording the operating parameter in the log file. Another example set of operating parameters may be "low output," "medium output," and "high output" for describing the output power of the generator. Other variations are possible.

The receiving device 31 and sending device 33, which may be combined into a single device or incorporated into controller 100*a*, may include a specific interface (e.g., RS 485, controller area network (CAN), and Ethernet). A variety of protocols for the data communication may be used, including Modbus, J-1939, CANOpen, universal serial bus (USB), another protocol, or a derivative thereof. Modbus is a master and slave protocol defined by the Modbus Organization, which is incorporated by reference. The Modbus protocol may assign unique address to all devices connected to the bus 11. In some example, only a designated master device may send commands, including commands for other device to report data (e.g., status signals). In another example, any device may unilaterally send data using Modbus. A Modbus command or packet may include a destination address and a checksum. The destination address may indicate a unique address for a device in communication with the bus 11. The destination address may specify a classification of device. Example classifications include generator controllers, transfer switch controllers, and breaker controllers. A different alphanumeric code may correspond to each classification of device.

RS 485 is a communication hardware specification defined in TIA-485-A by the Telecommunications Industry Association/Electronic Industries Alliance (TIA/EIA) and published March of 2003, which is incorporated by reference. RS 485 or other types of communication used over the bus 11 may be a multidrop protocol. A multidrop protocol allows any number up to a maximum number of components to be connected to the bus 11. The components may be connected and removed from the bus 11. An arbitration algorithm may executed by the generator controllers or receiving and sending devices in order to determine when devices send data. In one example, a device is designated to send data, while the others listen for data. The arbitration algorithm advance to designate the next device as sender, and the process continues until all devices have been the sender. The process may repeat continuously or at a predetermined interval.

Various strategies may be used to allow multiple devices to communicate on the bus 11. Each device may be assigned an address or node identification (ID). In one example, all of the devices utilize a single modulation frequency, which may be user configurable. Each device may be assigned a different time slice or time window. The time slice may be assigned according to the physical connection to the bus 11. For example, the generator connected at connection point A on the bus 11 communicates during a time slice assigned to connection point A, and the generator connected at connection point B communicates during a time slice assigned to connection point B. Alternatively, the time slice may be assigned according to the order in which the devices connected to the bus 11 or are initialized. The time slices may be assigned by a master device.

In addition or in another example, the devices connected to the bus 11 may communicate using a publish and subscribe system. In the publish and subscribe system the senders of messages do not direct the messages to particular addresses. Instead, receivers subscribe to specific senders and retrieve those messages from the bus 11. In other words, the receiver (e.g., controller 101*a*) listens for messages on the bus 11 and saves those messages to which the receiver subscribes. The receiver may extract and save those messages that match a predetermined list of addresses or identifiers. The publish and subscribe system may be either a poll and response system, in which requests are sent and replies received, and broadcast system, in which data is sent to update previously sent data.

In another example, each of the devices (e.g., generators) that communicates via the bus 11 may be assigned a different modulation frequency. In this way, communication signals sent from the generator 101*a* can be easily isolated and filtered from communication signals from other devices. Thus, the receiving device 31 may filter signals using one or more modulation frequencies used by other devices, and the sending device 33 sends signals from the controller 100*a* using a frequency assigned to the generator 101*a*. The receiving device 31 may identify, organize, and label received messages by sender according to modulation frequency.

Figure 4:
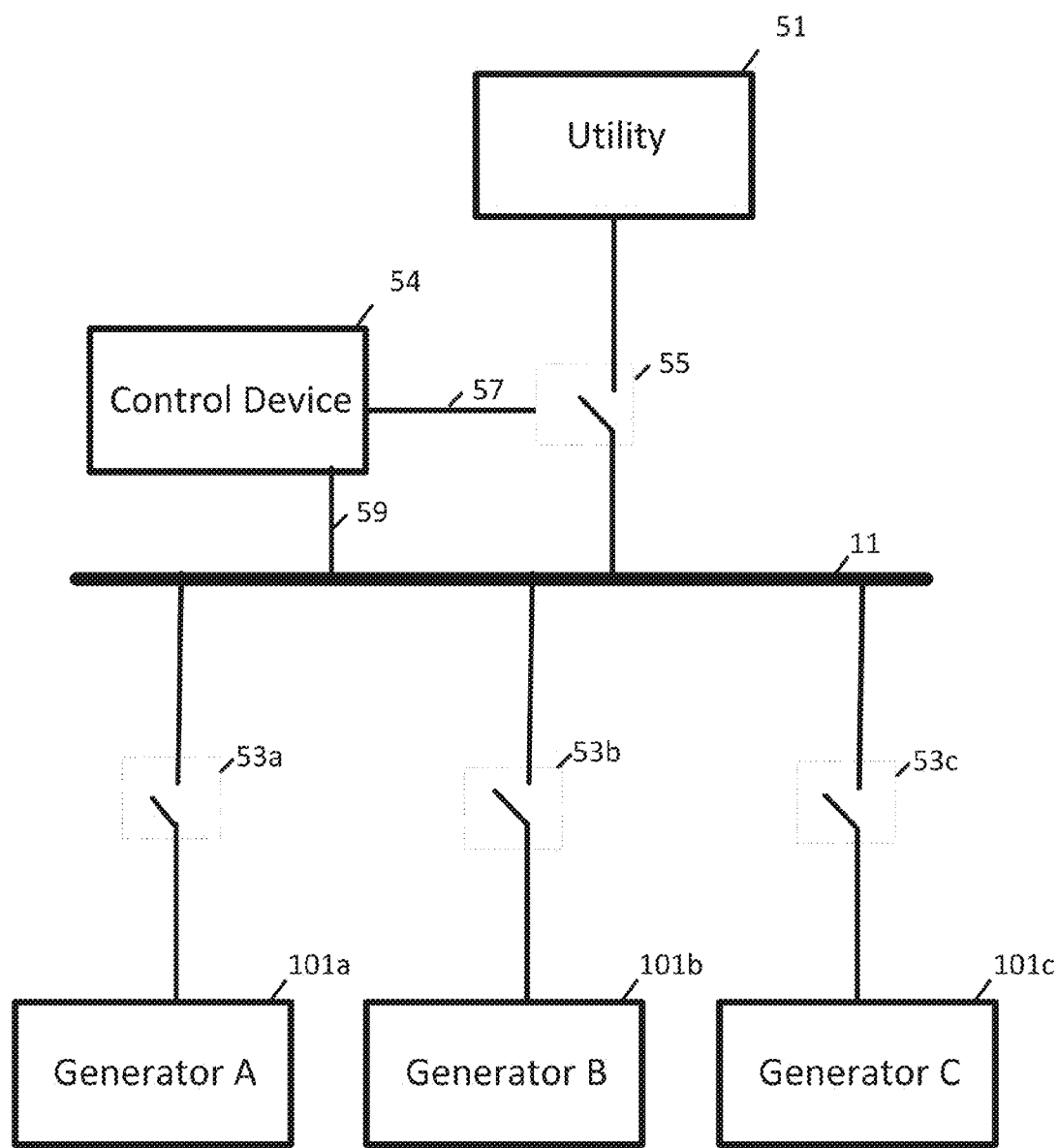
FIG. 4 illustrates another example system including communication over a power bus.
Figure 5:
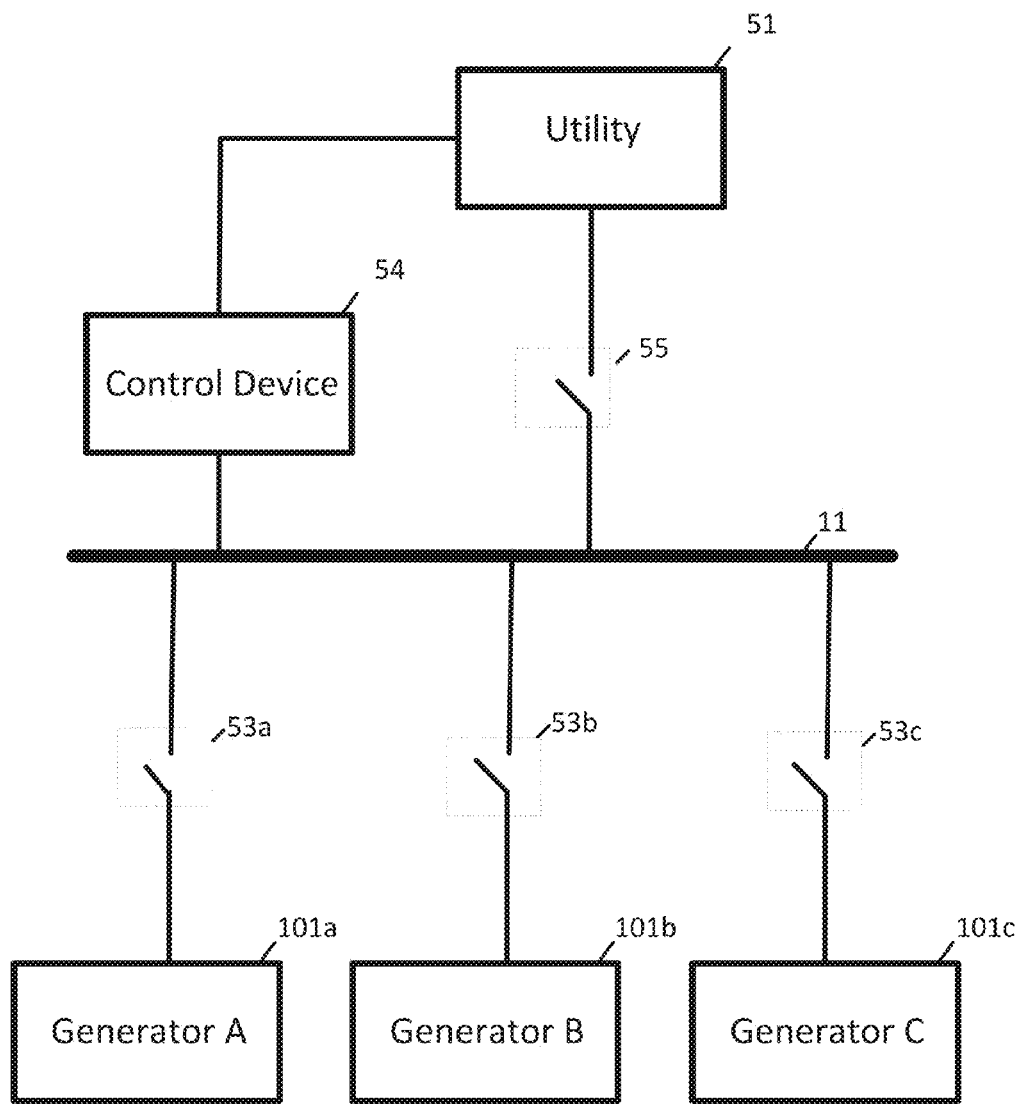
FIG. 5 illustrates another example system including communication over a power bus.

FIGS. 4 and 5 illustrate example systems including communication over a power bus. The bus 11 communicates with two or more generators that exchange messages with central control device 54. Generators A, B, and C, may each be coupled to the bus 11 through one of breakers 53*a-c*. The central control device 54 may send and receive data communication signals represented messages via the bus 11 through communication line 59.

The central control device 54 may include a control panel that receives user inputs for installing, configuring, or maintaining the generator system. The central control device 52 may generate and send a control panel command signal to any of the generators 101*a-c* or all of the generators 101*a-c* in unison. The control panel command signal may include any of the generator commands described above. The central control device 54 may modulate the control panel command signal with the power signal.

The central control device 54 may also receive commands. In the example of FIG. 4, the central control device 54 controls the breaker 55 through connection 57 according to commands received from generator controllers. The generator controllers may communicate a ready signal that prompts the central control device 54 to selectively connect or disconnect the utility 51 from the bus 11.

In the example of FIG. 5, the central control device 54 receives data communication from the utility 51. The data communication may include utility status signal that describes a status of the power company or utility. The status signal could describe an upcoming rolling black out, an overloaded circuit, or a high price peak. The data communication may include may include utility commands that instruct the generator system to start operating or instruct the generator system to produce excess power to provide back to the utility 51.

The central control device 54 may receive status signals from the generators 101*a-c* and record the generator status or other operating parameters in a log according to identifiers extracted from the status signals and timestamps describing the time when the signals are received.

Figure 6:
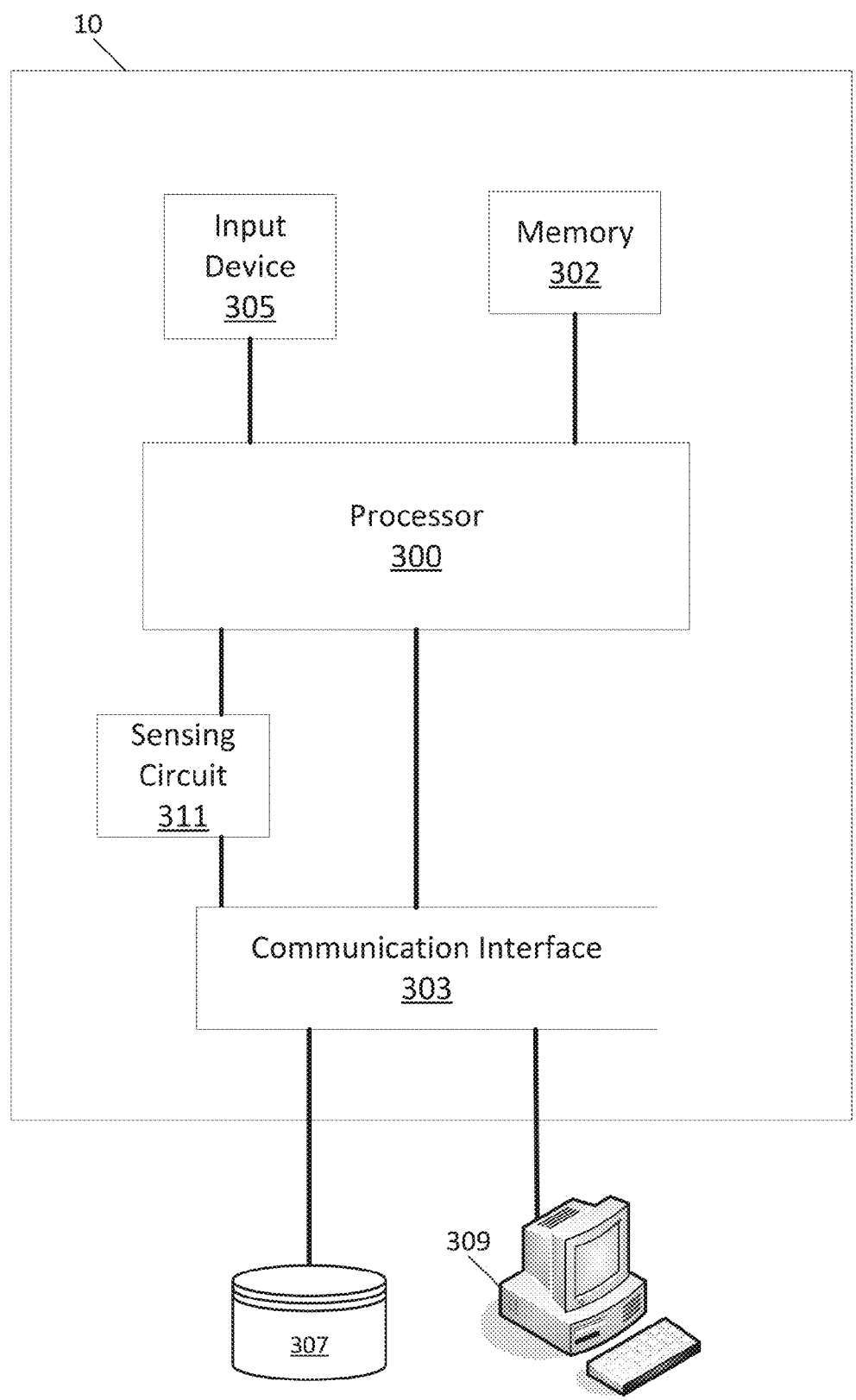
FIG. 6 illustrates an example controller of the system including communication over a power bus.

FIG. 6 illustrates an example controller 10 of the system including communication over a power bus. The controller 10 may correspond to one or more of generator controller 100a, generator controller 100b, central control device 54, or another device. The controller 10 may include a processor 300, a memory 302, and a communication interface 303. The generator controller 10 may be connected to a workstation 309 or another external device (e.g., control panel) and/or a database 307. Optionally, the generator controller 10 may include an input device 305 and/or a sensing circuit 311. The sensing circuit 311 receives sensor measurements from the sensors above. Additional, different, or fewer components may be included.

The memory 302 may store a set of possible operating states for parallel generators. A portion of the memory 302 may be assigned to each generator in a set of parallel generators. Possible operating states may include disconnected, connected, running, disabled, an error identifier, over speed, a speed value, an output value, or a phase angle. The operating states may be entered using input device 305.

The processor 300 may receive a signal over the bus 11. The processor 300 may extract an identifier value from the signal that is associated with a particular generator. The generator may be a known generator from a known configuration. The configuration may be entered using input device 305. The generator may be identified by type such as power rating, manufacturer, or model number.

The processor 300 may extract data for the identified generator from the signal and modify a portion of the set of operating parameters that corresponds to the identified generator based on the first signal. For example, the processor 300 may rewrite a portion of memory 302 that stores the current operating speed for the generator. The processor 300 may store in memory 302 a status for the breaker for the generator that connects the output of the generator to the bus 11.

The processor 300 may receive a second signal over the bus 11, extract another identifier value from the second signal that is associated with another generator. The processor 300 may extract data for the other generator from the signal and modify another portion of the set of operating parameters such that a first parameter from the set of operating parameters corresponds to a first generator of the parallel generators and a second parameter from the set of operating parameters corresponds to a second generator of the parallel generators.

The processor 300 may execute one or more processes based on the signals received from the bus 11. The processes may include any combination of a discovery process, first on process, verification process, and a load sharing process.

The discovery process includes identification of the generators connected to the bus. The generator controllers may announce their presence through an identification message including a unique identifier or a semi-unique identifier (e.g., by device type or model). The processor 300 receives identification messages to identify all of the generators connected to the bus. When a predetermined number of generators are connected, the processor 300 may generate local commands such as generator start command or breaker close command.

The transmission of the identification messages may be according to an assigned time slice. In another example, the transmission of the identification messages may be in response to a ping or other request sent by the processor 300 using the communication interface 303. The processor 300 may eavesdrop on communications between the other generators and the central control device 54. The transmission of the identification messages may be in response to the respective device being connected to the bus 11 or another change in configuration.

The first on process is a procedure in which the processor 300 identifies the first generator to close to the bus 11. The processor 300 may designate the first controller to close to the bus 11 according to a predetermined order, the first generator to request to close to the bus 11, or another order. The processor 300 may generate a command message addressed to other generators based on the first on process. The command message may instruct another generator to switch the other generator's breaker to close to the bus 11.

The verification process insures that parallel generators or soon to be parallel generators are operating at compatible levels. The processor 300 may receive operating parameters from a plurality of generators and compare the voltage output values, power values, frequency values, or phase angle values to a threshold value. The threshold values may be target values for any of the parameters. The threshold values may be a threshold range, and the processor 300 may determine whether the difference between receive values falls within the threshold range.

The load sharing process exchanges real and reactive power information between generators to permit load sharing. The processor 300 may receive operating parameter messages from a plurality of generators that describes the current output of the generators. The processor 300 may adjust the output of the generators in order to equalize or configure the load among the generators. In one example, the loads are balanced across generators by increasing or decreasing the rate that fuel is supplied to the engines. The fuel adjustment may change the real power supplied by the generators. In one example, the loads are balanced among generators by modifying the current levels supplied to the alternator field windings. The current levels in the field windings may change the reactive power supplied by the generators.

The processor 300 may generate a return signal (third signal). The return signal includes data indicative of the operation of the generator associated with controller 10. The return signals may be transmitted to the bus 11 and received by the generators or other device coupled to the bus. The return signal may include an identifier for the generator associated with controller 10. The identifier may be entered using input device 305.

Figure 7:
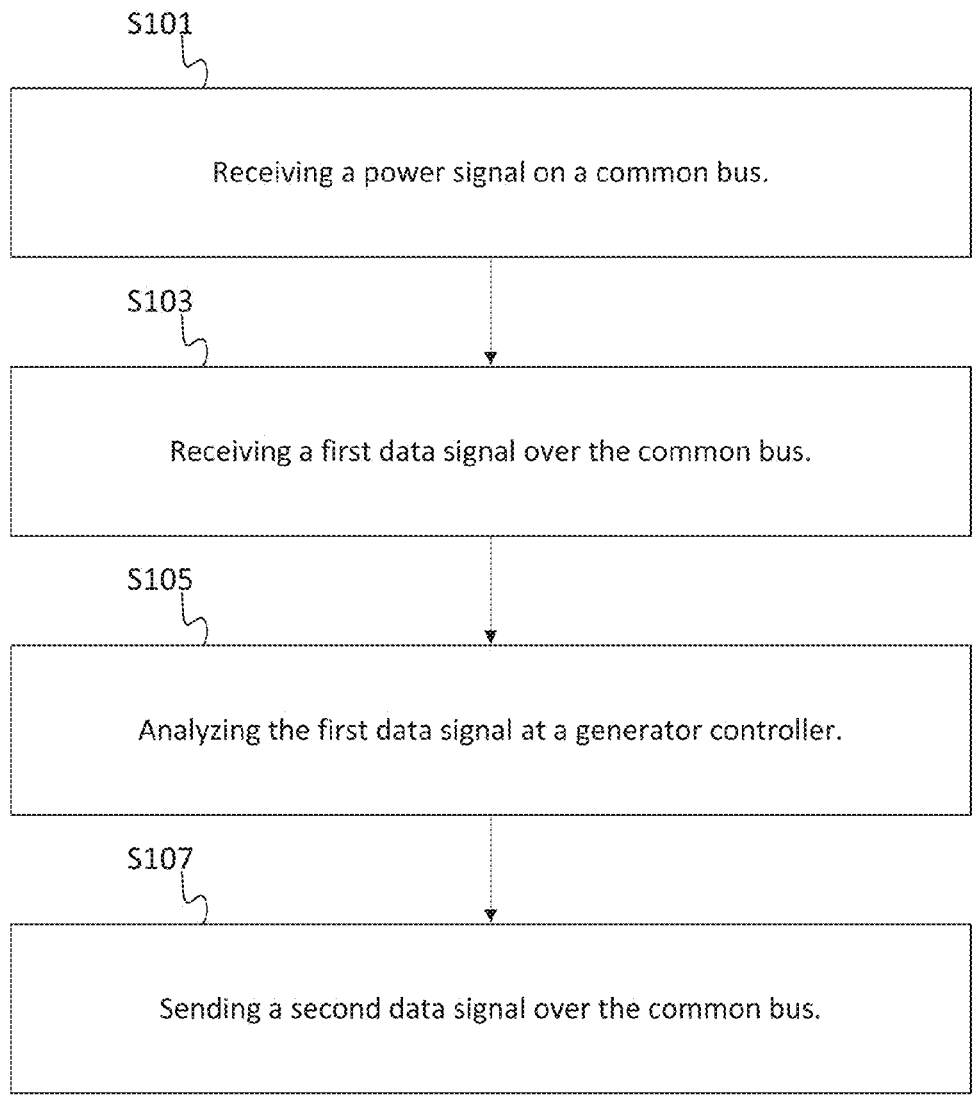
FIG. 7 illustrates example flowchart for communication over a power bus.

FIG. 7 illustrates example flowchart for communication over a power bus. The methods in FIG. 7 may, in some instances, be implemented as logic or software executable by a controller, such as controller 10. Additional, different, or fewer acts may be provided. The acts may be performed in the order shown or other orders. The acts may also be repeated.

At act S101, the controller receives a power signal on a common bus. The controller may identify the existence of the power signal on the bus. In one example, the controller is power from the common bus and a live bus is identified from the controller being online. The controller may be a generator controller associated with a generator connected to the common bus or an external controller not limited to a single generator.

At act S103, the controller receives a first data signal over the common bus. The first signal may include modulated data from another device. The modulated data may indicate the existence of the other device. The modulated data may indicate the current output of the other device to the common bus. The modulated data may include a command for the controller to execute.

At act S105, the controller analyzes the first data signal. The controller may extract an identifier from the first data signal to discover the existence of the other device. The controller may extract the current output of the other device and store the current output in a log. The controller may compare the current output of the other device to a threshold to identify an error condition. The controller may extract a command from the first data signal and execute the command. The command may cause a change in the operation of a generator associated with the controller.

At act S107, the controller generates and sends a second data signal over the common bus. The second data signal may be in response to the first data signal. The second data signal may include an acknowledgment message that confirms receipt of the first data signal. The second data signal may include a command message in response to the first data signal. The second data signal may include a current output or other output parameters of the generator associated with the controller.

The processor 300 may include a general processor, digital signal processor, an application specific integrated circuit (ASIC), field programmable gate array (FPGA), analog circuit, digital circuit, combinations thereof, or other now known or later developed processor. The processor 300 may be a single device or combinations of devices, such as associated with a network, distributed processing, or cloud computing.

The memory 302 may be a volatile memory or a non-volatile memory. The memory 302 may include one or more of a read only memory (ROM), random access memory (RAM), a flash memory, an electronic erasable program read only memory (EEPROM), or other type of memory. The memory 302 may be removable from the network device, such as a secure digital (SD) memory card.

In addition to ingress ports and egress ports, the communication interface 303 may include any operable connection. An operable connection may be one in which signals, physical communications, and/or logical communications may be sent and/or received. An operable connection may include a physical interface, an electrical interface, and/or a data interface.

The communication interface 303 may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 302 or database 307) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor may receive instructions and data from a read only memory or a random access memory or both. The essential elements of a computer are a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

I claim:

1. A method comprising:
    detecting, by a first generator controller at a generator including a rotating field, a power signal on a common bus configured to transmit alternating current (AC) power and data, wherein the power signal, at least in part, is associated with an additional power source separate from the generator;
    receiving, at the first generator controller, a status signal of the additional power source from a second controller via the common bus configured to transmit AC power and data;
    extracting an identifier for the additional power source from the status signal transmitted via the common bus configured to transmit AC power and data;
    generating a return signal in response to the status signal received via the common bus configured to transmit AC power and data messages, the return signal based on operating parameters of the generator which includes the rotating field;
    modulating the return signal on the power signal at a modulation frequency, wherein the modulation frequency for the return signal is different than a modulation frequency for the status signal of the additional power source; and
    sending, via the common bus configured to transmit AC power and data, the return signal to the generator which includes the rotating field.

2. The method of claim 1, wherein the status signal includes a connection status with the common bus and the additional power source.

3. The method of claim 1, wherein the generator is a first generator, and the additional power source is a second generator.

4. The method of claim 1, wherein the status signal includes a switch setting associated with a connection between a utility and the common bus.

5. The method of claim 1, wherein the return signal describes an operating speed of the generator, whether the generator is on or off, an output from a sensor associated with the generator, or a setting for a breaker for the generator.

6. The method of claim 1, wherein the return signal describes a generator command for the additional power source.

7. The method of claim 6, wherein the generator command includes a synchronization command, a speed command, an activation command, a deactivation command, or command to close the generator to the bus.

8. The method of claim 1, further comprising:
    receiving, at the generator controller, a control panel command signal from a central control device, wherein the central control device is configured to modulate the control panel command signal with the power signal.

9. A method comprising:
    identifying, by a generator controller at a generator, an alternating current (AC) power signal on a common bus, wherein the AC power signal, at least in part, is associated with an additional power source;
    receiving, at the generator controller, a data signal of the additional power source from a controller via the common bus, wherein the data signal of the additional power source is modulated on the AC power signal of the common bus;

generating a return signal including a command for the additional power source;

modulating the return signal on the power signal at a modulation frequency, wherein the modulation frequency for the return signal is different than a modulation frequency for a status signal of the additional power source; and sending, via the common bus, the return signal.

10. The method of claim 9, further comprising:

extracting an identifier for the additional power source from the data signal; and storing the identifier for the additional power source in a log file.

11. The method of claim 9, wherein the additional power source includes a second generator, the method further comprising:

extracting a command from the second generator from the data signal; and executing the command at the generator controller.

12. An apparatus comprising:

a memory configured to store a set of operating parameters for parallel generators having rotating magnetic fields; and a generator controller configured to receive a data signal over a common bus identifying a first generator having a rotating magnetic field and modify the set of operating parameters based on the data signal, wherein the generator controller is configured to provide a power signal, produced by the first generator and the rotating magnetic field, to the common bus for a load, and wherein the generator controller is configured to send a return data signal over the common bus, wherein a modulation frequency for the return signal is different than a modulation frequency for the data signal.

13. The apparatus of claim 12, wherein a first parameter from the set of operating parameters corresponds to a first generator of the parallel generators and a second parameter from the set of operating parameters corresponds to a second generator of the parallel generators.

14. The apparatus of claim 12, wherein at least one of the set of operating parameters is selected from a predetermined list of operating states.

15. The apparatus of claim 12, wherein the return data signal includes data indicative of operations of the apparatus.

16. The method of claim 1, wherein the additional power source is an additional generator or a utility source.

* * * * *